(12) United States Patent
Zhang et al.

(10) Patent No.: US 12,114,487 B2
(45) Date of Patent: Oct. 8, 2024

(54) SEMICONDUCTOR MEMORY DEVICE HAVING BIT LINES AND ISOLATION FINS DISPOSED ON THE SUBSTRATE

(71) Applicant: Fujian Jinhua Integrated Circuit Co., Ltd., Quanzhou (CN)

(72) Inventors: Janbo Zhang, Quanzhou (CN); Li-Wei Feng, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 18/108,666

(22) Filed: Feb. 13, 2023

(65) Prior Publication Data

US 2023/0200057 A1  Jun. 22, 2023

Related U.S. Application Data

(63) Continuation of application No. 17/336,319, filed on Jun. 2, 2021, now Pat. No. 11,600,622.

(30) Foreign Application Priority Data

May 8, 2021  (CN) .......................... 202110500294.4

(51) Int. Cl.
*H10B 12/00* (2023.01)

(52) U.S. Cl.
CPC ......... *H10B 12/485* (2023.02); *H10B 12/053* (2023.02); *H10B 12/482* (2023.02)

(58) Field of Classification Search
CPC ... H10B 12/053; H10B 12/482; H10B 12/485
USPC ........................................................ 257/330
See application file for complete search history.

(56) References Cited

U.S. PATENT DOCUMENTS 10,068,907 B1 * 9/2018 Tsai .................... H01L 29/0649
2012/0261747 A1  10/2012 Park \* cited by examiner

*Primary Examiner* — Hoai V Pham
(74) *Attorney, Agent, or Firm* — Winston Hsu

(57) ABSTRACT

The present disclosure relates to a semiconductor memory device including a substrate, a plurality of buried word lines, a plurality of bit lines, and a plurality isolation fins. The substrate includes a plurality of active areas and a shallow trench isolation. The buried word lines are disposed in the substrate. The bit lines are disposed on the substrate. The isolation fins are disposed on the substrate, over each of the buried word lines respectively, wherein a portion of the isolation fins is disposed under the bit lines and overlapped with the bit lines.

19 Claims, 9 Drawing Sheets

SEMICONDUCTOR MEMORY DEVICE HAVING BIT LINES AND ISOLATION FINS DISPOSED ON THE SUBSTRATE

CROSS REFERENCE TO RELATED APPLICATIONS

This application is a continuation application of U.S. application Ser. No. 17/336,319, filed on Jun. 2, 2021. The content of the application is incorporated herein by reference.

BACKGROUND OF THE INVENTION

1. Field of the Invention

The present disclosure generally relates to a semiconductor memory device, and more particularly, to a dynamic random access memory (DRAM) device.

2. Description of the Prior Art

A dynamic random access memory (DRAM) device is one kind of volatile memory that has been widely incorporated as an essential portion in many electronics. A conventional DRAM device may include plural memory cells arranged into an array for data storage. Each memory cell may include a metal oxide semiconductor (MOS) transistor and a capacitor serially connected to the MOS transistor.

As the dimension of a DRAM device continues to shrink for higher integrity, it has been more and more difficult to fabricate the interconnecting structure for electrically connecting the memory cells. Meanwhile, various cell designs for forming DRAM devices that may have the transistors and capacitors configured structurally differently are still required to fulfill product needs and achieve a higher device density. Therefore, it is still intensively studied in the field to improve a DRAM process.

SUMMARY OF THE INVENTION

One of the objectives of the present disclosure provides a semiconductor memory device, in which the semiconductor memory device includes a comb-shaped or fence-shaped bit line having pins optionally connected or not connected to a transistor, so as to provide better functions and performances. The comb-shaped or fence-shaped bit line of the semiconductor memory device may be fabricated through a dual damascene process, and the fabrication of the semiconductor memory device may be achieved through a fast and convenient process flow for saving times and costs.

To achieve the purpose described above, one embodiment of the present disclosure provides a semiconductor memory device including a substrate, a plurality of buried word lines, a plurality of bit lines, and a plurality of isolation fins. The substrate includes a plurality of active areas and a shallow trench isolation. The buried word lines are disposed in the substrate. The bit lines are disposed on the substrate. The isolation fins are disposed on the substrate, over each of the buried word lines respectively, wherein a portion of the isolation fins is disposed under the bit lines and overlapped with the bit lines To achieve the purpose described above, one embodiment of the present disclosure provides a semiconductor memory device including a substrate, a plurality of buried word lines, and a plurality of bit lines. The substrate includes a plurality of active areas and a shallow trench isolation. The buried word lines are disposed in the substrate. The bit lines are disposed on the substrate, wherein each of the bit lines includes a comb-shaped structure, and the comb-shaped structure includes a plurality of pins being partially extended into the active areas.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 2 are schematic diagrams illustrating a semiconductor memory device according to a preferable embodiment in the present disclosure, wherein:

FIG. 1 shows a top view of a semiconductor memory device; and

FIG. 2 shows a cross-sectional view taken along a cross line A-A' in FIG. 1.

FIG. 3 to FIG. 12 are schematic diagrams illustrating a fabrication method of a semiconductor memory device according to a preferable embodiment in the present disclosure, wherein:

FIG. 3 shows a top view of a semiconductor memory device after forming an isolation layer;

FIG. 4 shows a cross-sectional view taken along cross lines B-B', C-C' in FIG. 3;

FIG. 5 shows a top view of a semiconductor memory device after forming isolation fins;

FIG. 6 shows a cross-sectional view taken along cross lines B-B', C-C' in FIG. 5;

FIG. 7 shows a cross-sectional view of a semiconductor memory device after forming a first photoresist structure;

FIG. 8 shows a cross-sectional view of a semiconductor memory device after forming a second photoresist structure;

FIG. 9 shows a top view of a semiconductor memory device after forming openings;

FIG. 10 shows a cross-sectional view taken along cross lines B-B', C-C' in FIG. 9;

FIG. 11 shows a cross-sectional view of a semiconductor memory device after forming spacers;

FIG. 12 shows a cross-sectional view of a semiconductor memory device after forming a conductive layer.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
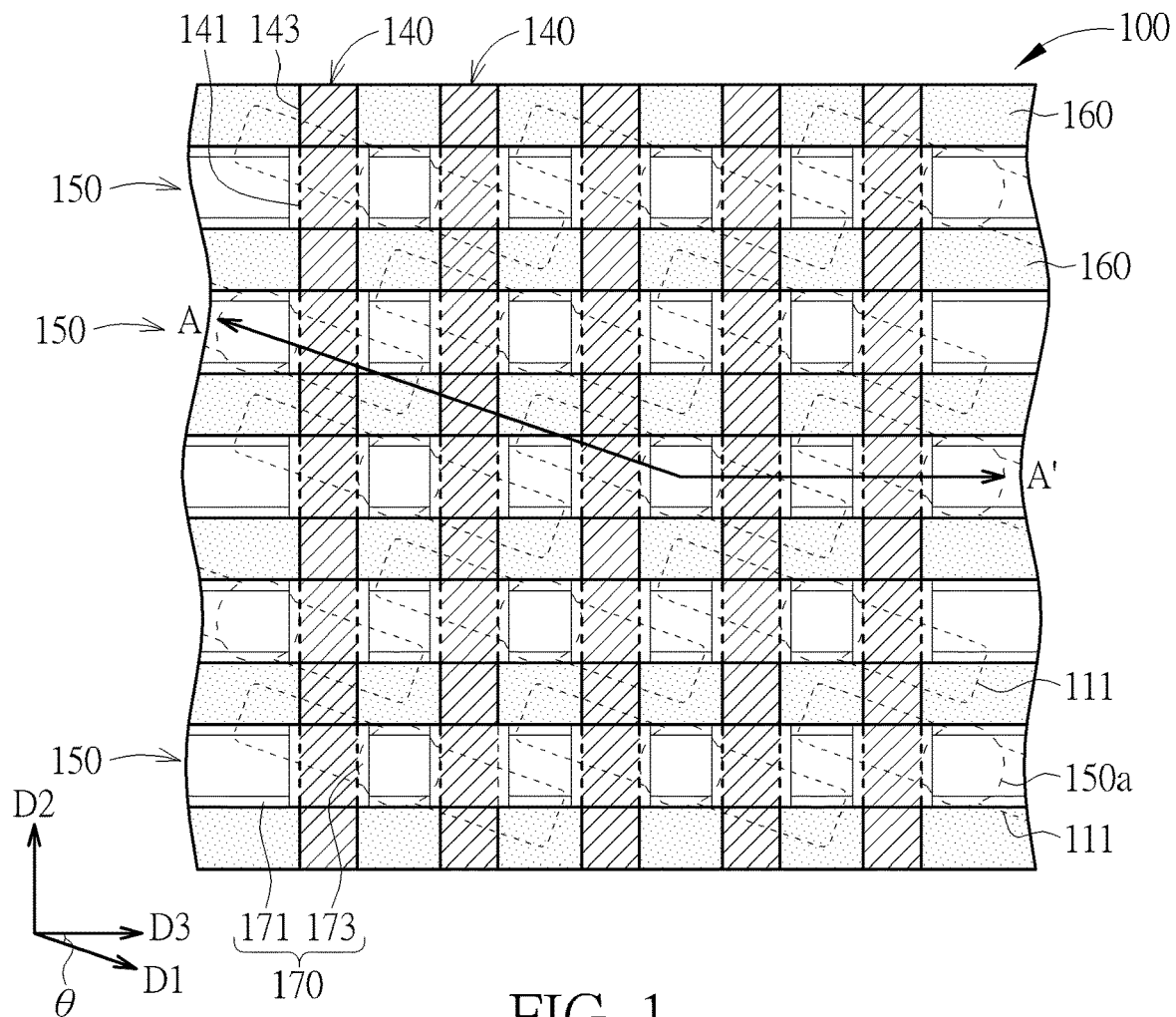
Figure 2:
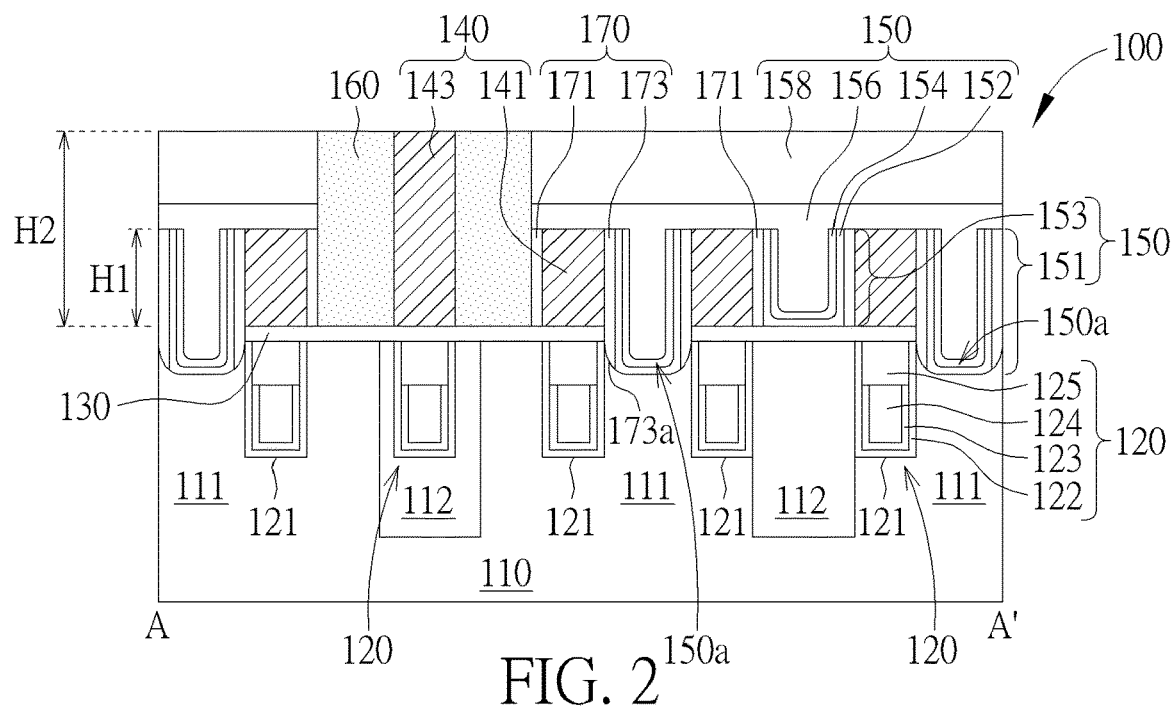

Please refers to FIG. 1 to FIG. 2, which illustrate schematic diagrams of a semiconductor memory device 100 according to the preferably embodiment in the present disclosure, with FIG. 1 and FIG. 2 respectively illustrating a top view and a cross-sectional view of the semiconductor memory device 100. The semiconductor memory device 100 includes a substrate 110 such as a silicon substrate, an epitaxial silicon substrate or a silicon on insulation (SOI) substrate, and at least one shallow trench isolation (STI) 112 is disposed in the substrate 110, to define a plurality of active areas (AAs) 111 in the substrate 110. In one embodiment, the active areas 111 are parallel with each other to extend along a direction D1, and preferably, the direction D1 is not perpendicular to the y-direction (such as a direction D2) or the x-direction (such as a direction D3), for example having an included angle θ about 30-120 degrees to the y-direction (such as the direction D2) or the x-direction (such as the direction D3) as shown in FIG. 1, but not limited thereto.

A plurality of gate structures 120 is disposed within the substrate 110 to serve as buried word line (BWL) for receiving and transmitting signals of each memory cell of the semiconductor memory device 100, wherein the gate structures 120 are parallel with each other and extend along the direction D2. In the present embodiment, the formation of the gate structure 120 is but not limited to be accomplished by the following processes. Firstly, a plurality of trenches 121 which are parallel with each other to extend along the direction D2 is formed within the substrate 110, and an interface dielectric layer 122, a gate dielectric layer 123, a gate electrode layer 124, and a mask layer 125 are sequentially formed in each trench 121 to form each of the gate structures 120. As shown in FIG. 2, the interface dielectric layer 122 is formed by entirely covering surfaces of each trench 121, followed by forming the gate dielectric layer 123 and the gate electrode layer 124 filled in a bottom portion of each trench 121, and forming the mask layer 125 filled in a top portion of each trench 121, over the gate dielectric layer 123 and the gate electrode layer 124. It is noted that, the mask layer 125 has a topmost surface (not marked in the drawings) leveled with a topmost surface (not marked in the drawings) of the substrate 110, and each of the gate structures 120 may be therefore embedded in the substrate 110.

Next, an isolating layer 130, preferably including an oxide-nitride-oxide (ONO) structure, is disposed on the topmost surface of the substrate 110, and a plurality of isolation fins 140 and a plurality of bit lines 150 are disposed over the isolating layer 130. Precisely speaking, the isolation fins 140 are also parallel with each other and extend along the direction D2, with each of the isolation fins 140 being in alignment with each of the gate structures 120 disposed underneath, and the bit lines 150 are parallel with each other and extend along the direction D3, to cross a portion of each of the isolation fins 140, as shown in FIG. 1. Moreover, with reference to FIG. 2, a portion the isolation fins 141 which is namely the aforementioned portion crossed by the bit lines 150 has a relative smaller height H1 in a projection direction (not shown in the drawings) which is perpendicular to the substrate 110, and the portion of the isolation fins 141 is namely disposed under the bit lines 150 to overlap with thereto. On the other hand, another portion the isolation fins 143 which is not crossed by the bit lines 150 has a relative greater height H2 in the projection direction, and the another portion of the isolation fins 143 obviously not overlap with the bit lines 150, as shown in FIG. 1 to FIG. 2. It is also noted that, each of the bit lines 150 includes a plurality of pins 151, 153 extended toward the substrate 110 along the projection direction, and each of the pins 151, 153 are alternately arranged with each of the isolation fins 140 along the direction D3. As shown in FIG. 2, each of the pins 151 further extends into the substrate 110 to directly in contact thereto, with a bottommost surface of each pin 151 being lower than the topmost surface of the substrate 110, and the pins 153 only extends over the substrate 110 and disposed on the insulating layer 130, without directly in contact with the substrate 110. Accordingly, the bottom of the pins 151 of the bit lines 150 may function like bit line contacts (BLCs) 150a, and which is disposed below the bit lines 150 to electrically connect a transistor (not shown in the drawings) for receiving or transmitting signals. In other words, the bit line contacts 150a and the bit lines 150 of the semiconductor memory device are namely monolithic.

On the other hand, each of the bit lines 150 further includes a semiconductor layer 152, a barrier layer 154, a conductive layer 156, and a mask layer 158 sequentially stacked from bottom to top. Preferably, the bit lines 150 may be formed through a process like the replacement metal gate process, thus that the semiconductor layer 152 and the barrier layer 154 may respectively include a U-shaped structure accordingly as shown in FIG. 2. The semiconductor layer 152 for example includes polysilicon or other suitable semiconductor materials, The barrier layer 154 for example includes titanium (Ti) or titanium nitride (TiN), and the conductive layer 156 for example includes a low resistant metal like tungsten (W), aluminum (Al) or copper (Cu), and the mask layer 158 for example includes silicon oxide (SiO$_x$), silicon nitride (SiN), silicon oxynitride (SiON), or silicon carbonitride (SiCN), but not limited thereto.

Furthermore, the semiconductor memory device 100 further includes a plurality of isolation structures 160 and a plurality of spacers 170, wherein the spacers 170 are disposed on sidewalls of the bit lines 150 and sidewalls of the isolation fins 140, and the isolation structures 160 are disposed within the rest gaps between the isolation fins 140 and the bit lines 150, over the insulating layer 130. Precisely speaking, spacers 171 are disposed on the sidewalls of the bit lines 150 along the direction D3, and spacers 173 are partially disposed on the sidewalls of the isolation fins 140 along the direction D2 as shown in FIG. 1. Accordingly, the spacers 171 may be disposed between the isolation structures 160 and the bit lines 150, and the spacers 173 may be disposed between the portion of the isolation fins 141 and the pins 151, 153 of the bit lines 150), with a portion of the spacers 173 further extending into the substrate 110 by the pins 151 to obtain a bottommost surface 173a also lower than the topmost surface of the substrate 110, as shown in FIG. 2. In one embodiment, the spacers 171, 173 may respectively include a monolayer structure as shown in FIG. 1 to FIG. 2, or include a multilayer structure for example at least having a first spacer layer (not shown in the drawing) and a second spacer layer (not shown in the drawing) stacked on the first spacer layer, but not limited thereto.

It is noted that, as shown in FIG. 1, the isolation structures 160 are disposed at two opposite sides of each bit line contact 150a along the direction D2, and the isolation fins 140 are disposed at two opposite sides of each bit line contact 150a along the direction D3, and a topmost surface of the isolation structures 160 is substantially the same as that of the another portion the isolation fins 143, and which is significantly higher than that of the portion of the isolation fins 141 (with reference to FIG. 2). Preferably, the isolation structures 160 and the isolation fins 140 may include different dielectric materials with etching selectivity, for example being selected from silicon oxide, SiN, SiON, SiCN and other suitable materials. In the present embodiment, the isolation fins 140 include SiN and the isolation structures 160 include silicon oxide, but not limited thereto.

Through this arrangement, the semiconductor memory device 100 of the present embodiment may provide better functions and performance, with each of the bit lines 150 having a comb shape or a fence shape, and with the pins 151, 153 of the bit lines 150 optionally in contact or not in contact with the substrate 110. The pins 151 which directly contact the substrate 110 may therefore function like the bit line contacts 150a. Also, each of the pins 151, 153 are connected with each other by the conductive layer 156, and the portion of the isolation fins 141 are disposed between the pins 151, 153 and overlapped with the conductive layer 156 of the bit lines 150 for further isolating each pins 151, 153 of the bit lines 150. Due to the arrangements of the bit lines 150, the semiconductor memory device 100 may be fast and conveniently fabricated through a simplified process flow, so as to save times and costs.

In order to enable one of ordinary skill in the art to implement the present disclosure, a fabricating method of a semiconductor memory device 100 of the present disclosure is further described below. Please refer to FIG. 3 to FIG. 13, which respectively illustrates the forming processes of the semiconductor memory device 100 according to a preferable embodiment in the present disclosure are illustrated, wherein FIG. 3 and FIG. 5 are top views of a semiconductor memory device 100 during the forming processes, FIG. 4 and FIG. 6 are cross-sectional views taken along cross lines B-B', C-C' in FIG. 3 and FIG. 5, and other drawings are cross-sectional views of a semiconductor memory device 100 during the forming processes.

Figure 3:
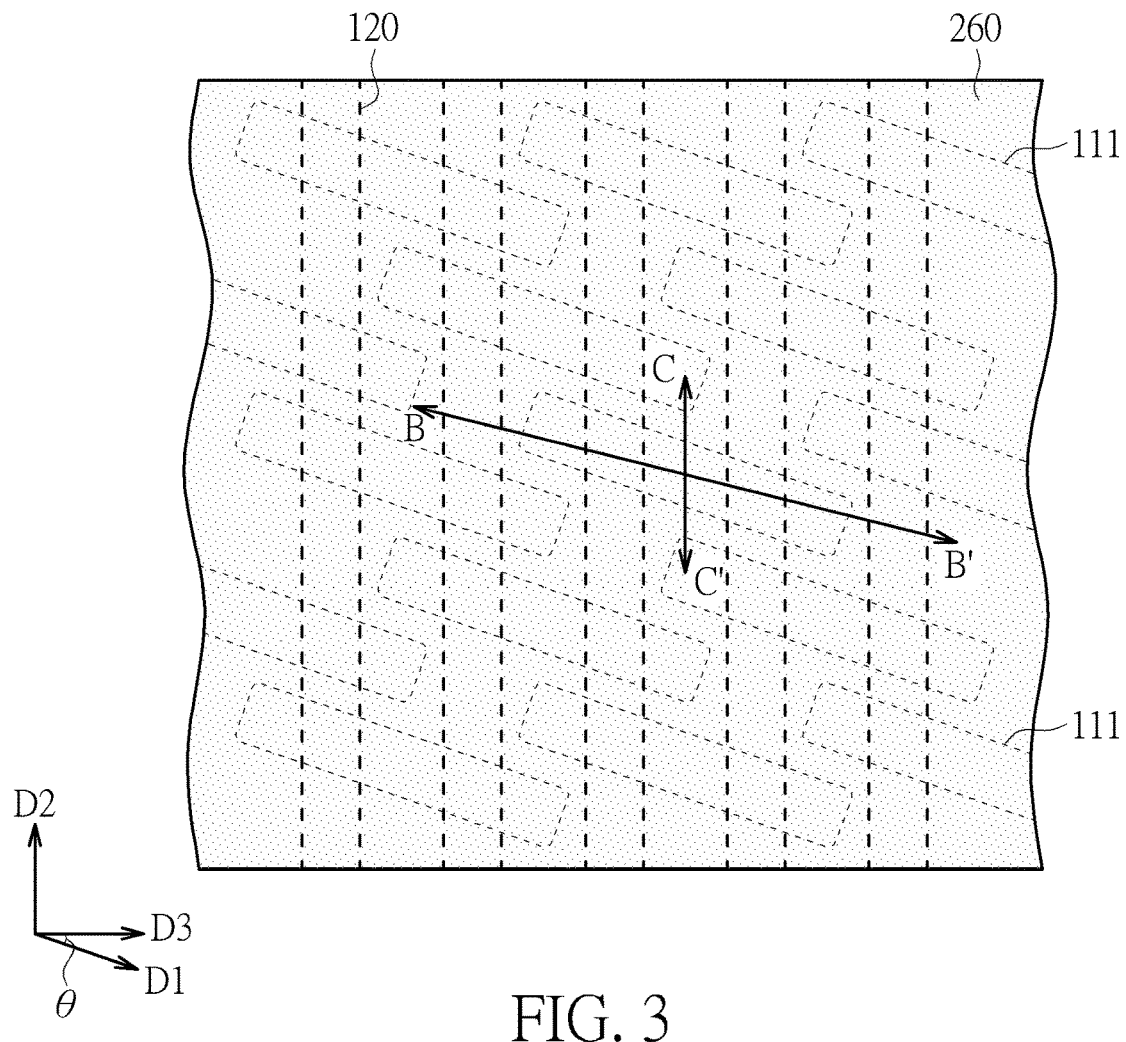
Figure 4:
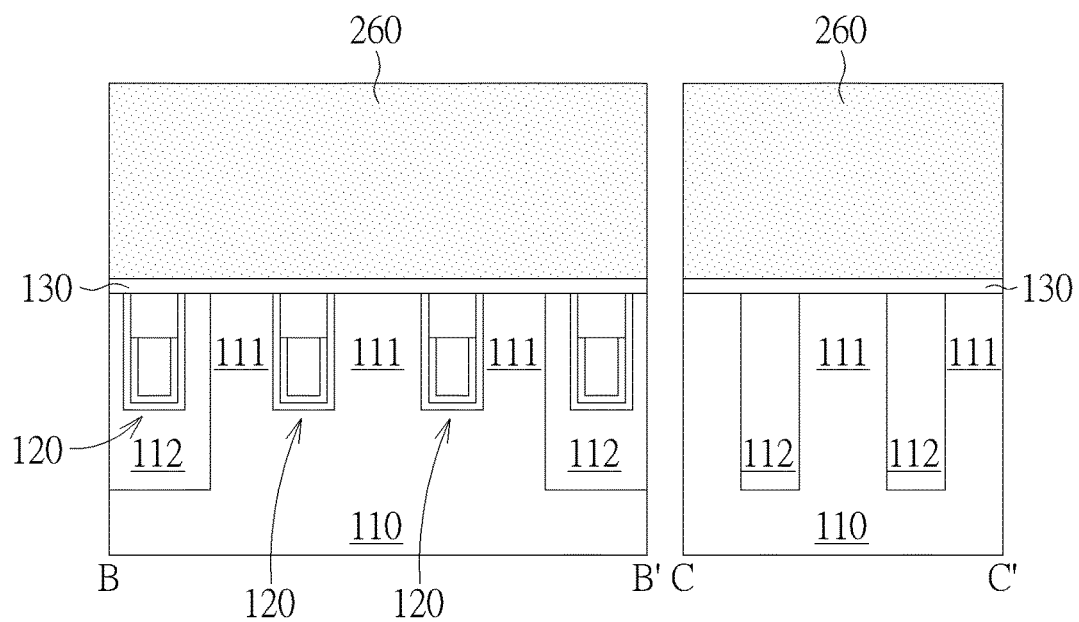

Firstly, as shown in FIG. 3 to FIG. 4, the substrate 110 is provided, with the substrate 110 having the STI 112 and the active areas 111 formed therein, and the gate structures 120 is formed in the substrate 110 and the insulating layer 130 is formed on the substrate 110, with top surfaces of the gate structures 120 being coplanar with the topmost surface of the substrate 110, and with the insulating layer 130 covering the active areas 111, the STI 112, and the gate structures 120. It is noted that, the detailed features of the gate structures 120, as well as the formation thereof have been mentioned above and which may not be redundantly described hereinafter.

As shown in FIG. 3 to FIG. 4, an isolation layer 260, for example including a dielectric material like silicon oxide, SiN, SiON or SiCN, is entirely formed on the isolating layer 130, for covering all of the active areas 111 and the STI 112 underneath. In the present embodiment, the isolation layer 260 preferably includes silicon oxide, but is not limited thereto.

Figure 5:
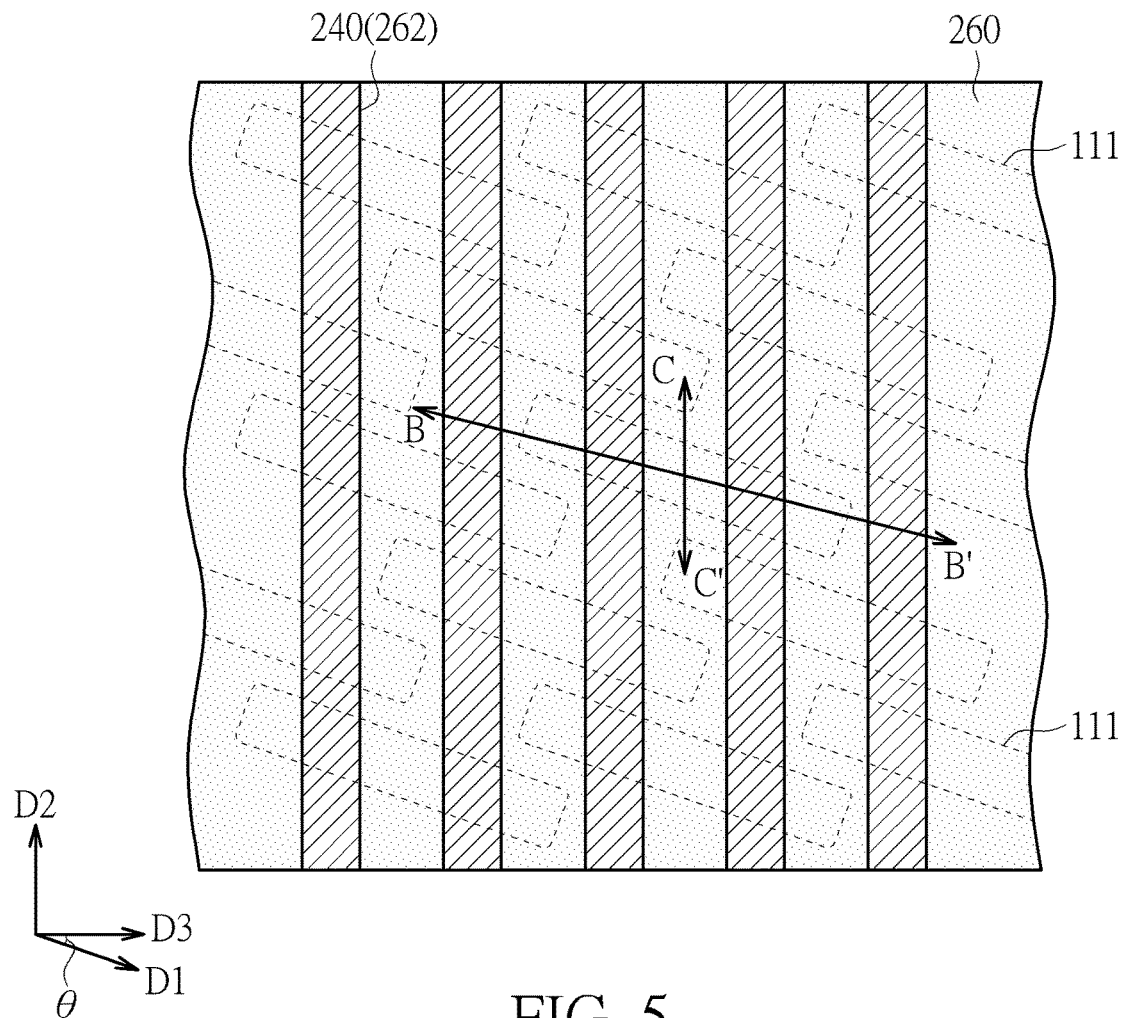
Figure 6:
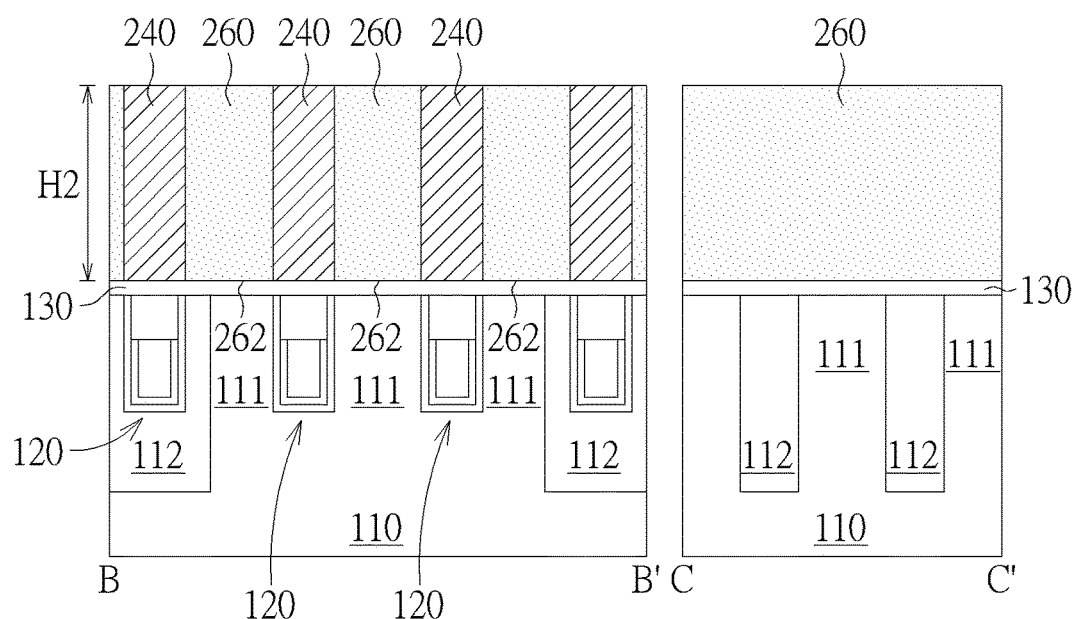

Next, as shown in FIG. 5 to FIG. 6, a plurality of isolation fins 240 are formed within the isolation layer 260 to extend along the direction D2. In one embodiment, the formation of the isolation fins 240 may be carried out by firstly removing a portion of the isolation layer 260 to form a plurality of trenches 262 in the isolation layer 260, with each of the trenches 262 being parallel with each other and extending along the direction D2 to partially expose the isolating layer 130 underneath, and filling a dielectric material in the trenches 262 to form the isolation fins 240 with coplanar top surfaces with the isolation layer 260. Accordingly, the isolation fins 240 may obtain the same height as the isolation layer 260, such as the height H2 as shown in FIG. 6. The dielectric material of the isolation fins 240 may be silicon oxide, SiN, SiON or SiCN, but is not limited thereto. Preferably, the dielectric material of the isolation fins 240 may have an etching selectivity with respect to the dielectric material of the isolation layer 260, such as SiN and $SiO_2$, but not limited thereto.

Figure 7:
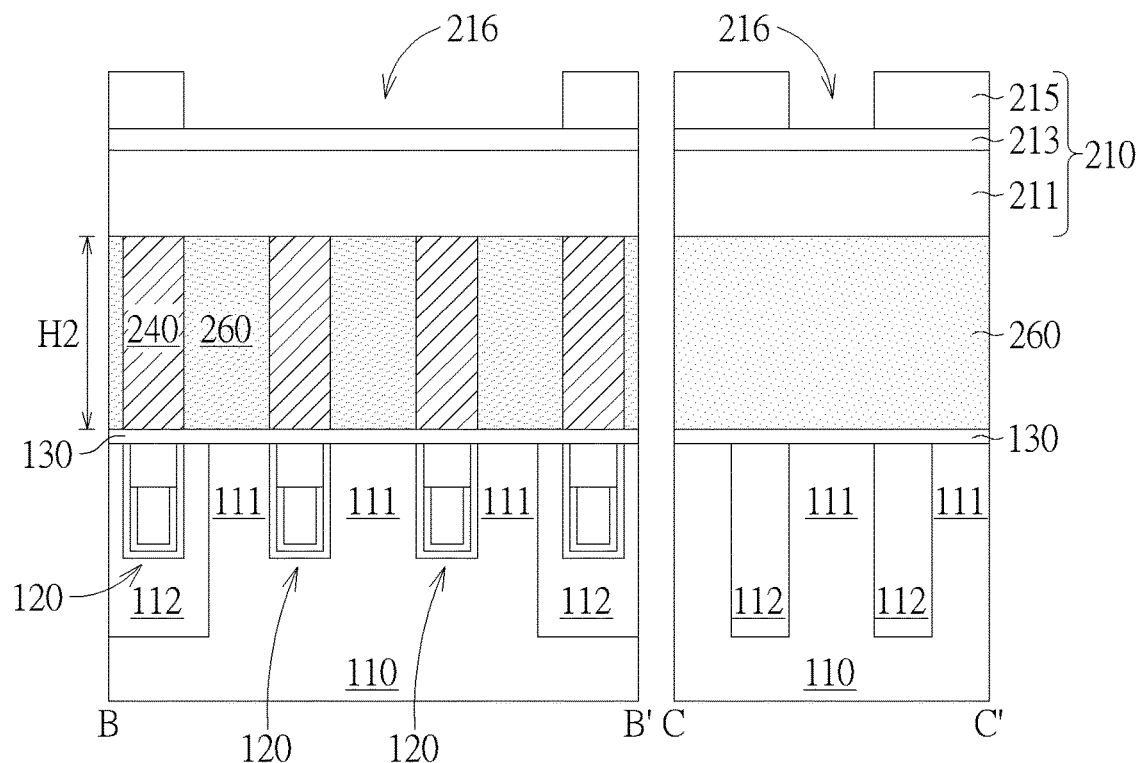
Figure 8:
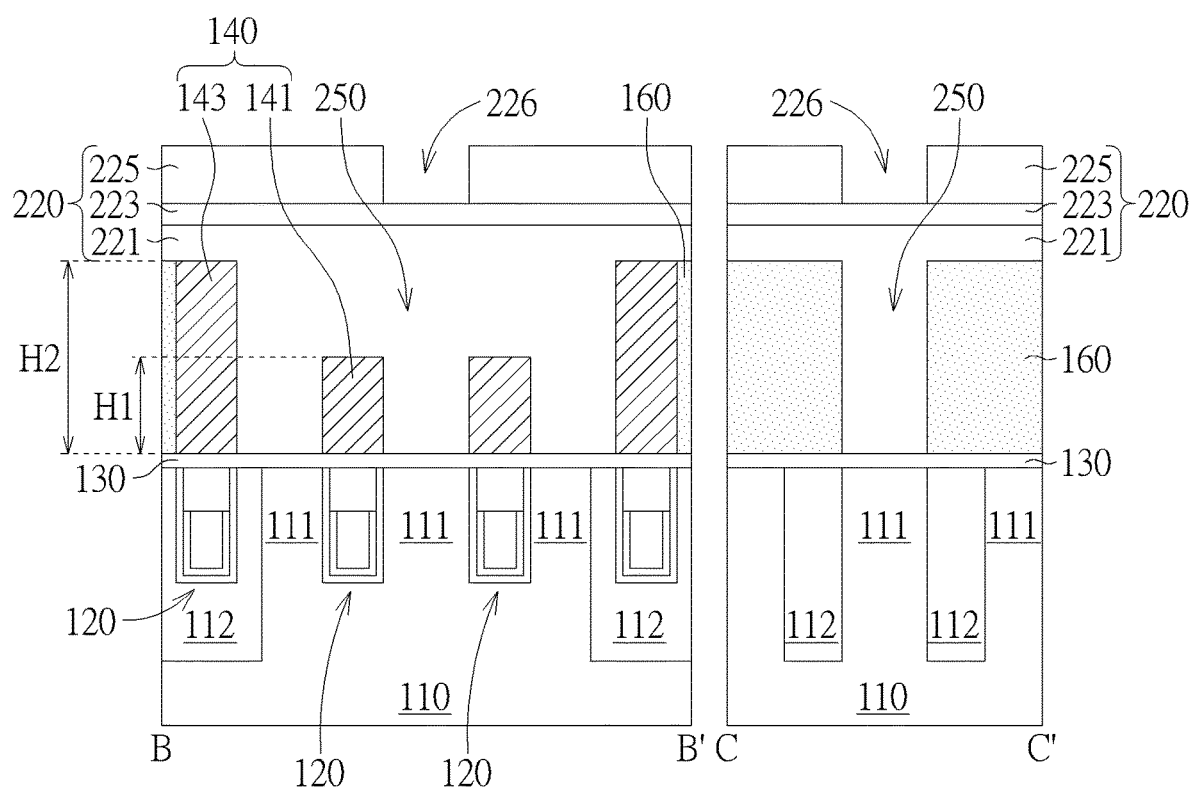
Figure 9:
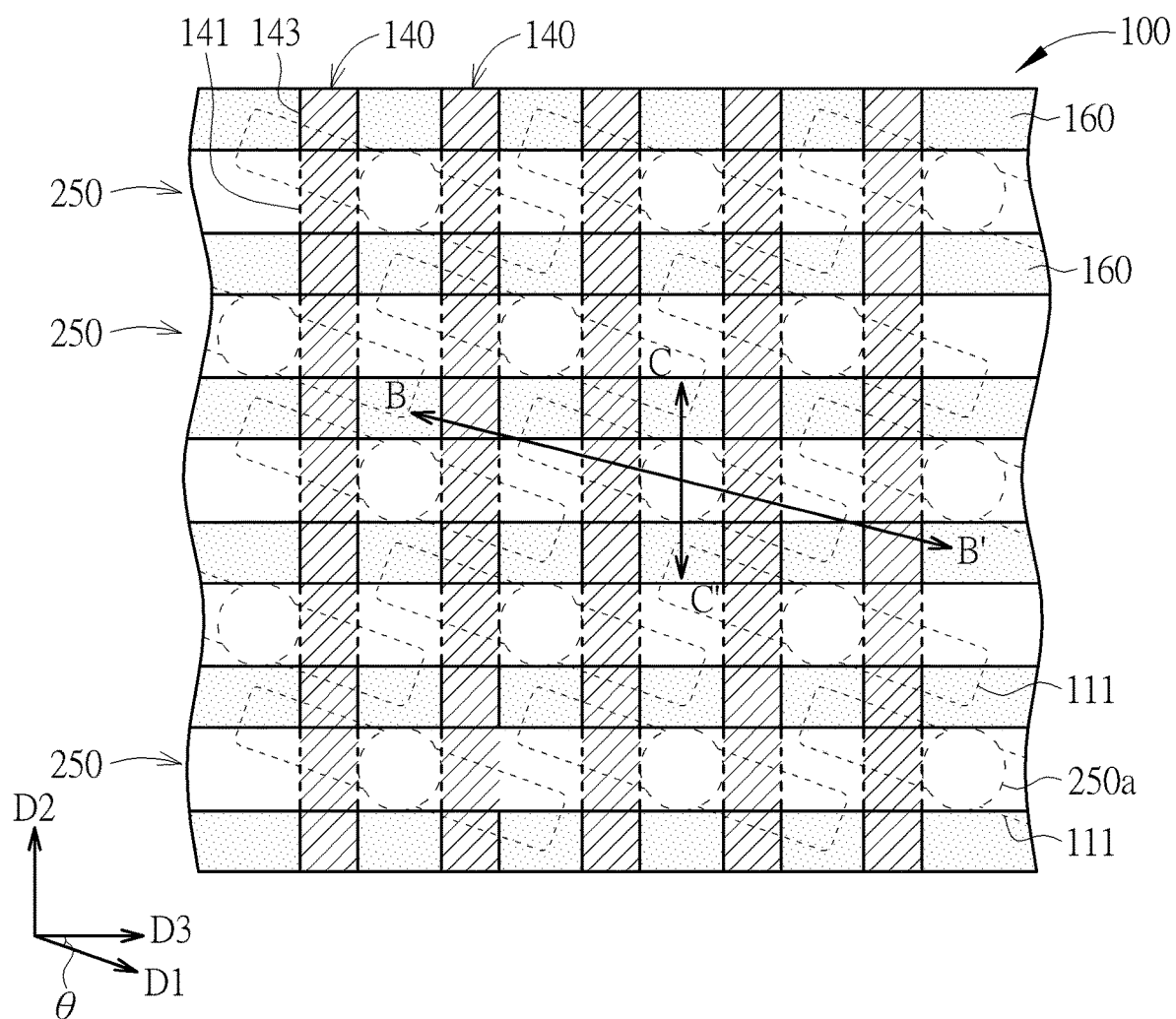

In the following processes, at least one bit line trench is formed followed by forming at least one bit line 150 within the bit line trench. As shown in FIG. 7 to FIG. 10, at least one trench opening 250 and at least one via opening 250a are sequentially defined and formed to consist the bit line trench. In one embodiment, the trench opening 250 and the via opening 250a may be formed through a dual damascene process such as a trench first damascene process. Precisely speaking, a first photoresist structure 210 is firstly formed over the substrate 110 for defining the trench opening 250, with the first photoresist structure 210 including a sacrificial layer 211 such as an organic dielectric layer (ODL), an anti-reflective layer 213 such as a dielectric anti-reflective coating (DARC) layer, and a first photoresist layer 215 stacked from one over another as shown in FIG. 7, and at least one etching process (not shown in the drawings) is performed by transferring trench patterns 216 of the first photoresist layer 215 into the anti-reflective layer 213, the sacrificial layer 211, the isolation layer 260, and the isolation fins 240 underneath, to form the trench opening 250. Meanwhile, after the etching process, remained isolation layer 260 form the isolation structure 160 as shown in FIG. 8. Also, the etching process is performed by using the isolating layer 130 as an etch stop layer, so that a portion of the isolating layer 130 may be exposed from the trench opening 250 as shown in FIG. 8 to FIG. 9. On the other hand due to the etching selectivity between the materials of isolation layer 260 and the isolation fins 240, the isolation fins 240 exposed from the trench pattern 216 may be partially etched instead of completely etched, thereby obtaining the isolation fins 141 with a reduced height H1 as in comparison with the height H2 of rest portions of the isolation fins 143.

Figure 10:
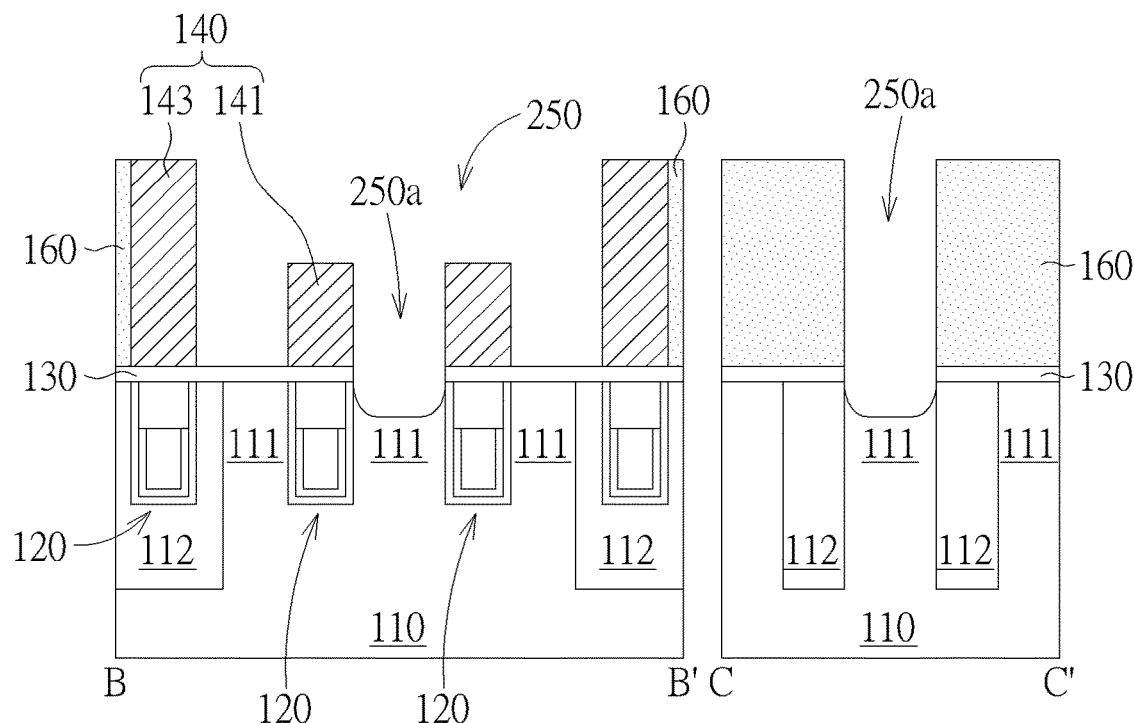

After forming the trench opening 250, the first photoresist structure 210 is completely removed, and a second photoresist structure 220 is then formed for defining the via opening 250a. As shown in FIG. 8, the second photoresist structure 220 also includes a sacrificial layer 221 such as an ODL, an anti-reflective layer 223 such as a DARC layer, and a second photoresist layer 225 stacked from one over another, with the sacrificial layer 221 filling in the trench opening 250 to obtain a planar top surface, and another etching process is performed to transfer via patterns 226 of the second photoresist layer 225 into the anti-reflective layer 223, the sacrificial layer 221, the insulating layer 130 and a portion of the substrate 110, to form the via opening 250a as shown in FIG. 9 to FIG. 10. It is noted that the via opening 250a further extends into the substrate 100 to expose the substrate 110 therefrom. People in the art should also understand that, although only a single trench opening 250 and a single via opening 250a is illustrated in FIG. 7 to FIG. 9, the practical number of the trench opening 250 and the via opening 250a is not limited thereto and while may be adjustable due to practical device requirement. For example, a plurality of the trench openings 250 and a plurality of the via opening 250a may be formed while being seen from a top view as shown in FIG. 8 to consist a plurality of the bit line trenches, and also, the practical number of the bit line trenches is based on the request number of bit lines 150 in the device.

Figure 11:
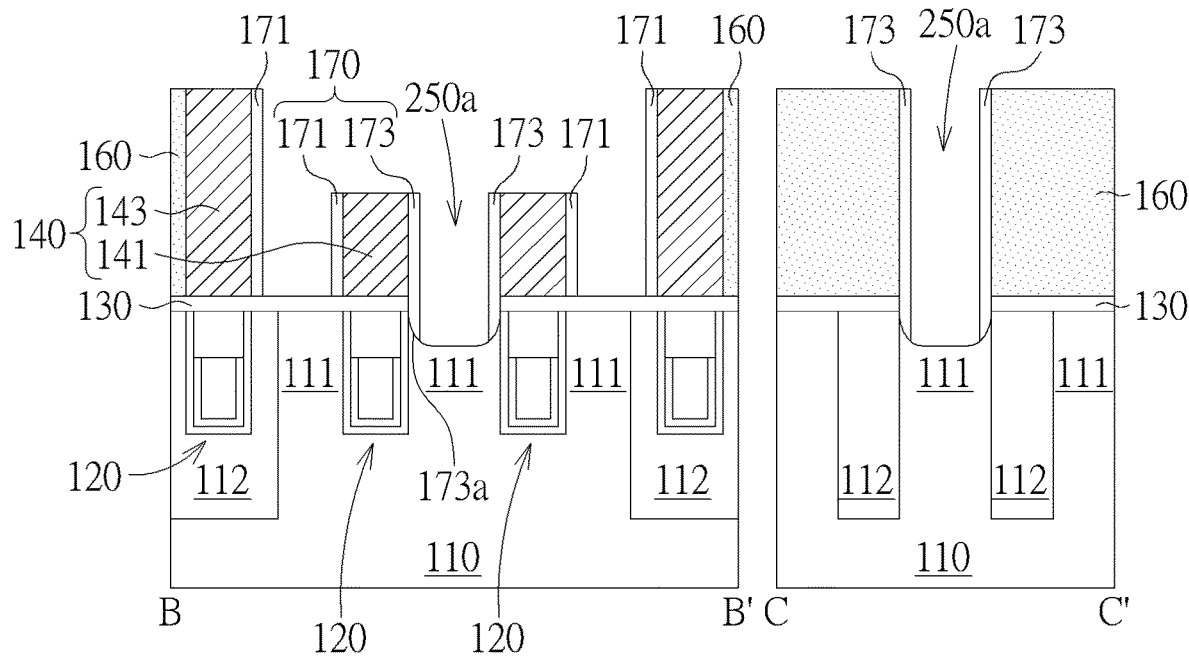

Next, as shown in FIG. 11, spacers 170 are formed on sidewalls of the bit line trench (namely, sidewalls of the trench opening 250 and the via opening 250a, and which may include a dielectric material like silicon oxide, SiN, SiON, SiCN or other suitable materials. In one embodiment, the spacers 170 may include a monolayer structure, and the formation thereof may but not limited to be accomplished by firstly depositing a dielectric material layer (not shown in the drawings) on the substrate 110, covering all exposing surfaces thereof, and performing an etching back process to remove the dielectric material layer disposed on horizontal surfaces, thereby remaining the spacers 171, 173 either between the bit line trench and the isolation fins 140 or between the bit line trench and the isolation structures 160. However, in another embodiment, the spacers may also include a multilayer structure, and the formation thereof may be accomplished through similar steps above. It is noted that, the spacers 171 disposed on sidewalls of the via trenches 250 are formed over the insulating layer 130, without directly in contact with the substrate 110, and the spacers 173 disposed on sidewalls of the via opening 250*a* may further extend into the substrate 110, to directly in contact with the substrate 110, with the spacers 173 having the bottommost surface 173*a* lower than the topmost surface of the substrate 110.

Figure 12:
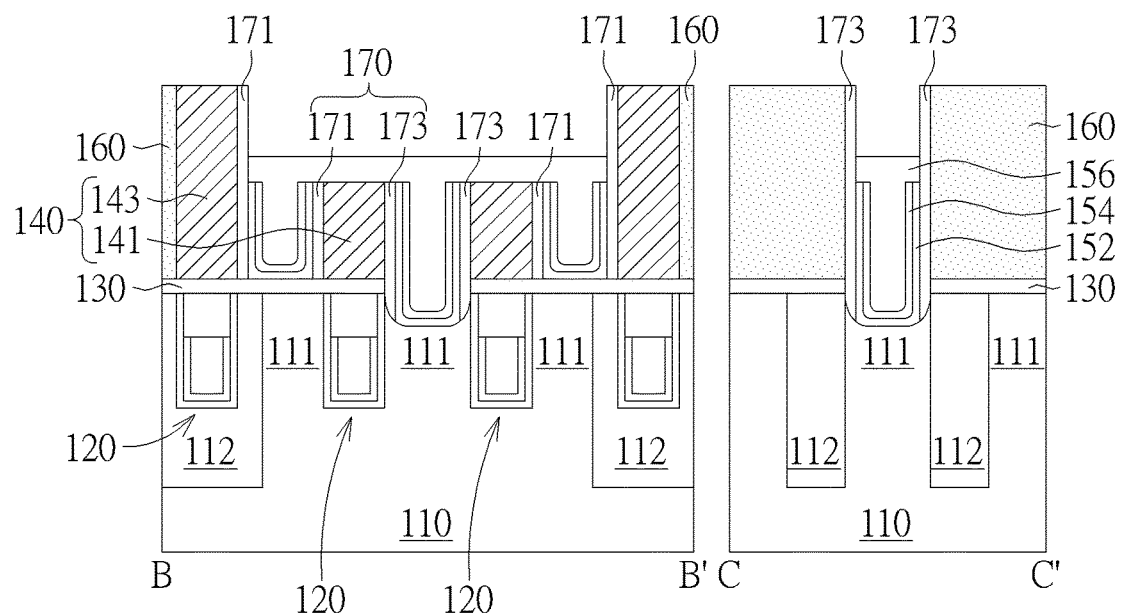
Figure 13:
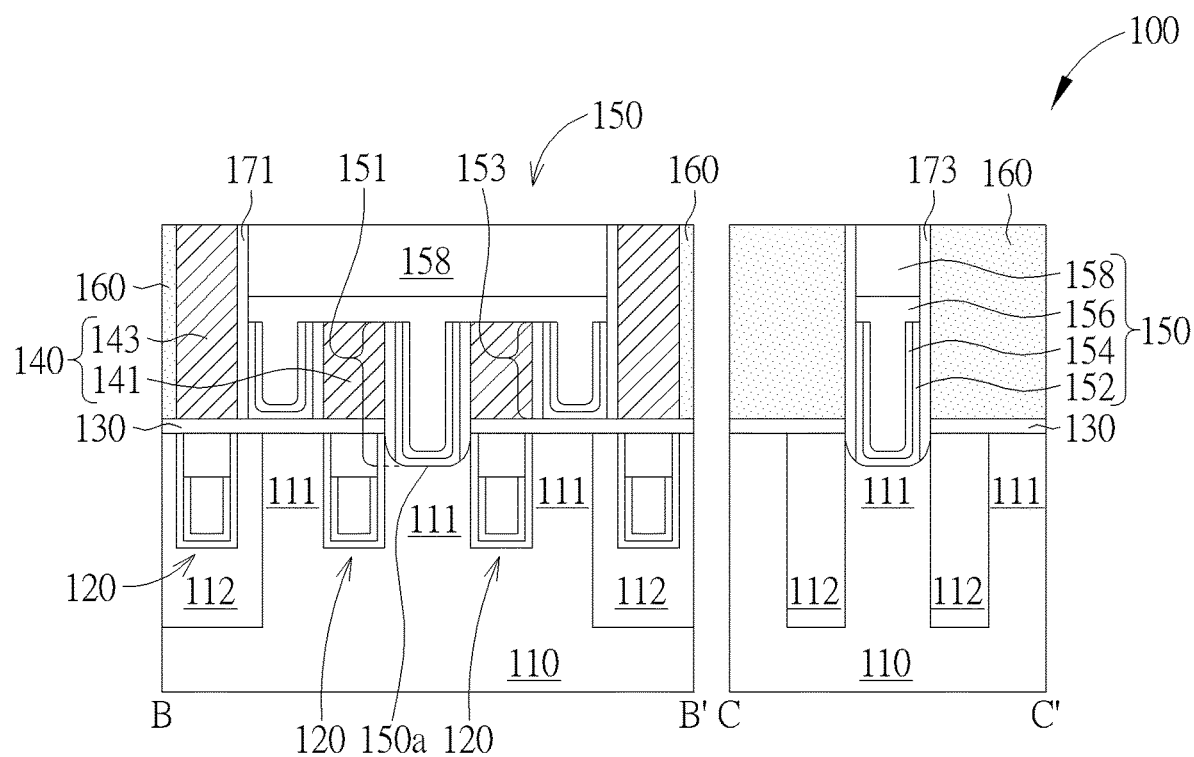
FIG. 13 shows a cross-sectional view of a semiconductor memory device after forming a mask layer.

Finally, as shown in FIG. 12 to FIG. 13, at least one bit line 150 is formed to fill in the bit line trench for example through a process like the replacement metal gate process. Precisely speaking, the formation of the bit line 150 is carried out by sequentially forming a semiconductor material layer (not shown in the drawings) and a barrier material layer (not shown in the drawings) conformally over the substrate 110, performing an etching back process to remove the semiconductor material layer and the barrier material layer to form the semiconductor layer 152 and the barrier layer 154 on surfaces of the trench openings 250 and via openings 250*a* in an U-shape as shown in FIG. 12, and then, filling the conductive layer 156 in the bottom of each bit line trench. However, people in the art should fully understand that in another embodiment, the etching back process of the semiconductor material layer the barrier material layer may also be omitted, so as to form a conformal and continuous semiconductor layer (not shown in the drawings) and barrier layer (not shown in the drawings) over the substrate 110. It is noted that the semiconductor layer 152, the barrier layer 154, and the conductive layer 156 filled in the via opening 250*a* form the pins 151 of each bit line 150, to directly in contact with the substrate 110, the semiconductor layer 152, the barrier layer 154, and the conductive layer 156 filled in the trench opening 250 form the pins 153 of each bit line 150, to not directly in contact with the substrate 110, wherein each of the pins 151, 153 are connected with each other by the conductive layer 156 as shown in FIG. 12. Following these, the mask layer 158 is formed to fill in the top portion of each bit line trench, thereby consisting each of the bit lines 150. Accordingly, the bit line 150 may therefor obtain a comb-shaped structure or a fence-shaped structure while being seen in a cross-section view like FIG. 13, with the pins 151, 153 optionally extended into the substrate 110 to electrically connect thereto, and with the pin 151 being disposed between two adjacent pins 153 but not limited thereto.

Accordingly, the semiconductor memory device 100 of the preferably embodiment in the present disclosure may be obtained thereby, with the at least one bit line 150 performing like a comb-shaped structure or a fence-shaped structure to achieve better functions and performance. Due to the above-mentioned fabricating method, the comb-shaped bit lines or the fence-shaped bit lines may be formed by using a dual damascene process, in which, the trench opening 250 and via opening 250*a* may sequentially formed in the isolation layer 260 to consist the bit line trench, and each of the bit lines 150 may be formed then in the bit line trench. Then, the comb-shaped or fence-shaped bit lines may have the pins 151 for directly contacting the substrate 110 and the pins 153 without contacting the substrate 110, and with the pins 151, 153 in connection with each other by the conductive layer 156. Also, the bit lines 150 of the semiconductor memory device 100 are partially overlapped with the portion of the isolation fins 141, with the portion of the isolation fins 141 separating each pin 151, 153 of the bit lines 150. Thus, the semiconductor memory device 100 may be formed through a simplified process flow.

Figure 14:
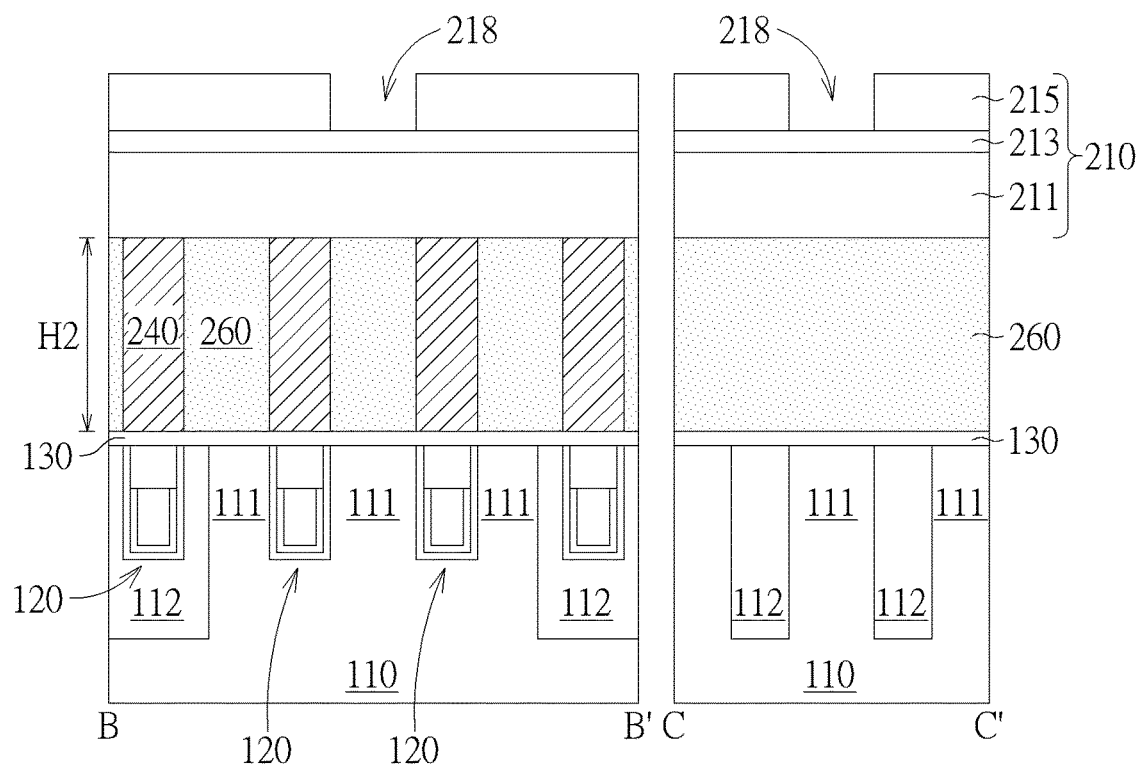
FIG. 14 to FIG. 15 are schematic diagrams illustrating a fabrication method of a semiconductor memory device according to another embodiment in the present disclosure.
Figure 15:
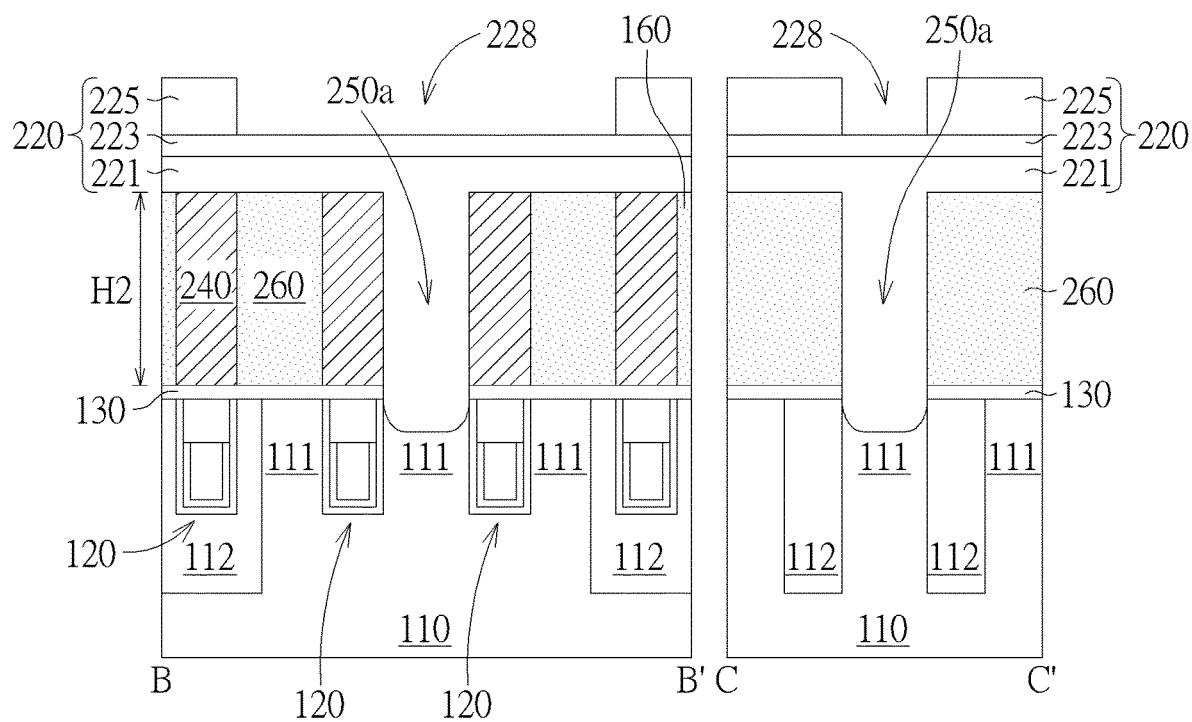
Figure 16:
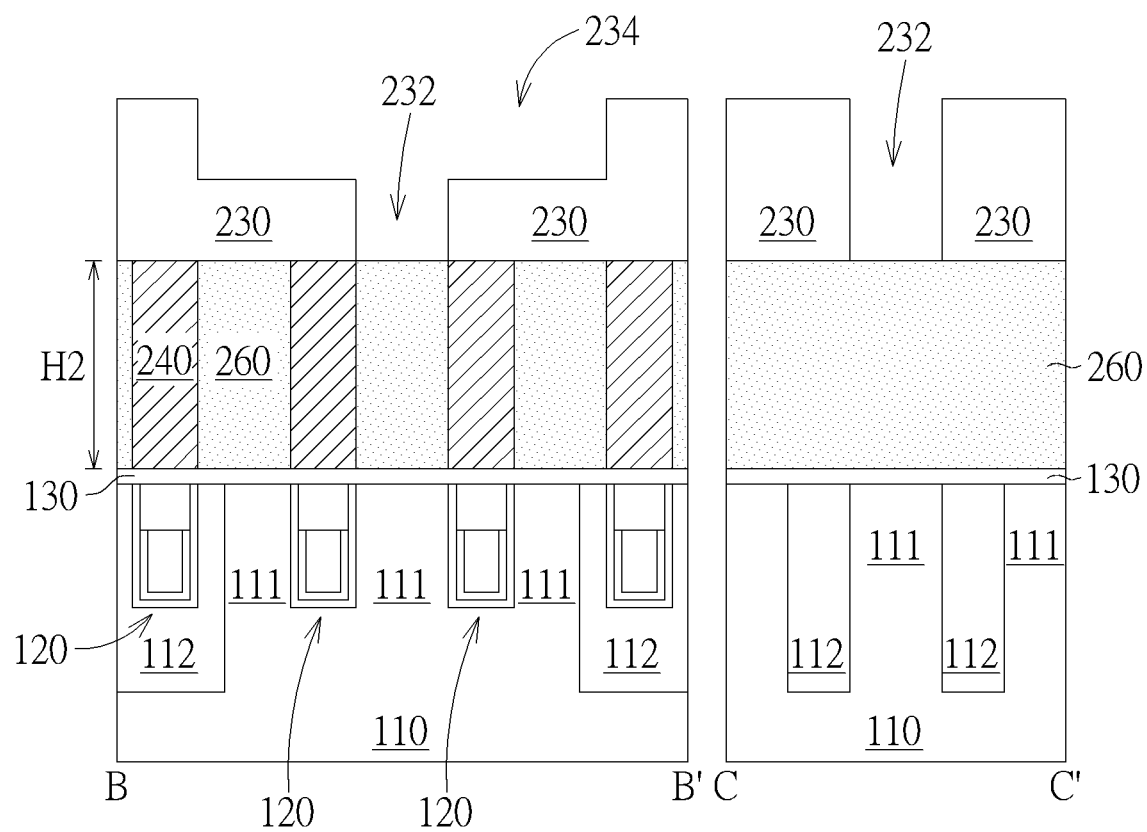
FIG. 16 is a schematic diagram illustrating a fabrication method of a semiconductor memory device according to another embodiment in the present disclosure.

In order to meet the practical product requirements, people skilled in the arts should easily understand that the fabricating method of the semiconductor memory device 100 in the present disclosure is not limited to be aforementioned, and which may include other variations. For example, in another embodiment, the formation of bit line trench may also be achieved through a via first dual damascene process. As shown in FIG. 14 to FIG. 15, the via opening 250*a* may also be firstly formed by transferring a via pattern 218 of the first photoresist layer 215, followed by forming the trench openings 250 by transferring the trench pattern 228 of the second photoresist layer 225. In this way, the via opening 250*a* and the trench opening 250 as shown in FIG. 9 to FIG. 10 may also be obtained thereby. Otherwise, in another embodiment as shown in FIG. 16, the first photoresist structure 210 and the second photoresist structure 220 may both used to pattern a mask layer 230, to sequentially transfer the via pattern 218 and the trench patterns 228 into the mask layer 230. Accordingly, via openings 232 and trench opening 234 may be both formed in the mask layer 230, with the via openings 232 penetrating through the mask layer 230, with the via opening 234 not penetrating through the mask layer 230, and with a portion of the via openings 232 overlapping with the trench opening 234. After that, an etching process is performed to simultaneously transfer the patterns of the via openings 232 and the trench opening 234 into the isolation layer 260, the primary isolation fins 240 and the substrate, so as to also obtain the via opening 250*a* and the trench opening 250 as shown in FIG. 9 to FIG. 10 in the same etching process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate, comprising a plurality of active areas and a shallow trench isolation;
   a plurality of buried word lines disposed in the substrate;
   a plurality of bit lines disposed on the substrate; and
   a plurality of isolation fins disposed on the substrate, over each of the buried word lines respectively, wherein a bottom surface of the isolation fins is higher than a bottommost surface of the bit lines and a portion of the isolation fins is disposed under the bit lines and overlapped with the bit lines.

2. The semiconductor memory device according to claim 1, wherein the isolation fins comprise different heights in a direction perpendicular to the substrate.

3. The semiconductor memory device according to claim 2, wherein another portion of the isolation fins is coplanar with a topmost surface of the bit lines.

4. The semiconductor memory device according to claim 1, wherein the portion of the isolation fins is disposed over the active areas, and the shallow trench isolation.

5. The semiconductor memory device according to claim 1, wherein each of the bit lines comprises a semiconductor layer, a barrier layer, and a conductive layer stacked from bottom to top, and the semiconductor layer and the barrier layer of each of the bit lines respectively comprises a U-shape structure.

6. The semiconductor memory device according to claim 5, wherein the conductive layer of each of the bit lines directly contacts top surfaces of the portion of the isolation fins.

7. The semiconductor memory device according to claim 5, wherein the conductive layer of each of the bit lines comprises a comb-shaped structure.

8. The semiconductor memory device according to claim 7, wherein the comb-shaped structure comprises a plurality of pins, and a portion of the pins is extended into the active areas.

9. The semiconductor memory device according to claim 5, further comprising:
a plurality of spacers, disposed on sidewalls of the isolation fins, and a portion of the spacers extended into the active areas, wherein a bottommost surface of the portion of the spacers is lower than a top surface of the substrate.

10. The semiconductor memory device according to claim 9, wherein each of the spacers is disposed between the isolation fins and the conductive layer, wherein each of the spacers comprises a multilayer structure.

11. The semiconductor memory device according to claim 1, further comprising:
a dielectric layer disposed on the substrate, and the isolation fins are disposed on the dielectric layer.

12. The semiconductor memory device according to claim 11, wherein the dielectric layer comprises an oxide-nitride-oxide structure.

13. A semiconductor memory device, comprising:
a substrate, comprising a plurality of active areas and a shallow trench isolation;
a plurality of buried word lines disposed in the substrate, wherein each of the buried word lines comprises an interface dielectric layer, a gate dielectric layer, a gate electrode layer, and a mask layer;
a plurality of bit lines disposed on the substrate; and
a plurality of isolation fins disposed on the substrate, over each of the buried word lines respectively, wherein a portion of the isolation fins is disposed under the bit lines and overlapped with the bit lines, wherein a height of the isolation fins disposed over the active areas is smaller than a height of the isolation fins disposed over the shallow trench isolation.

14. The semiconductor memory device according to claim 13, wherein a top surface of the isolation fins disposed over the shallow trench isolation is coplanar with a topmost surface of the bit lines.

15. The semiconductor memory device according to claim 13, wherein a top surface of the isolation fins disposed over the active areas directly contacts the bit lines.

16. The semiconductor memory device according to claim 13, wherein each of the bit lines comprises a semiconductor layer, a barrier layer, and a conductive layer stacked from bottom to top, and the semiconductor layer and the barrier layer of each of the bit lines respectively comprises a U-shape structure.

17. A semiconductor memory device, comprising:
a substrate, comprising a plurality of active areas and a shallow trench isolation;
a plurality of buried word lines disposed in the substrate;
a plurality of bit lines disposed on the substrate; and
a plurality of isolation fins disposed on the substrate, over each of the buried word lines respectively, wherein the isolation fins comprise different heights in a direction perpendicular to the substrate and a portion of the isolation fins is disposed under the bit lines and overlapped with the bit lines.

18. The semiconductor memory device according to claim 17, wherein the portion of the isolation fins is disposed over the active areas, and the shallow trench isolation and another portion of the isolation fins is coplanar with a topmost surface of the bit lines.

19. The semiconductor memory device according to claim 17, wherein each of the bit lines comprises a semiconductor layer, a barrier layer, and a conductive layer stacked from bottom to top, and the semiconductor layer and the barrier layer of each of the bit lines respectively comprises a U-shape structure.

* * * * *